(12) United States Patent
Suzuki et al.

(10) Patent No.: US 7,659,131 B2
(45) Date of Patent: Feb. 9, 2010

(54) PROCESS FOR PRODUCING A FLAT PANEL RADIATION DETECTOR AND A FLAT PANEL RADIATION DETECTOR

(75) Inventors: Junichi Suzuki, Kyoto (JP); Nobuya Nagafune, Kyoto (JP); Kenji Sato, Otsu (JP); Toshinori Yoshimuta, Takatsuki (JP); Toshiyuki Sato, Kyoto (JP)

(73) Assignee: Shimadzu Corporation, Kyoto-Fu (JP)

( * ) Notice: Subject to any disclaimer, the term of this patent is extended or adjusted under 35 U.S.C. 154(b) by 259 days.

(21) Appl. No.: 11/136,601

(22) Filed: May 23, 2005

(65) Prior Publication Data

US 2005/0272181 A1    Dec. 8, 2005

(30) Foreign Application Priority Data

Jun. 8, 2004  (JP) .............................. 2004-169791

(51) Int. Cl.
*H01L 21/00* (2006.01)
(52) U.S. Cl. .................. 438/48; 438/56; 257/E31.04
(58) Field of Classification Search ......... 438/126–127, 438/48, 56
See application file for complete search history.

(56) References Cited

U.S. PATENT DOCUMENTS 6,373,130 B1 * 4/2002 Salaville ..................... 257/704
7,112,800 B2 * 9/2006 Sato et al. ............. 250/370.09

OTHER PUBLICATIONS

Patent Abstracts of Japan for JP2002-311144 published Oct. 23, 2002.

* cited by examiner

*Primary Examiner*—Thao X Le
*Assistant Examiner*—Elias Ullah
(74) *Attorney, Agent, or Firm*—Darby & Darby P.C.

(57) ABSTRACT

Because a restricting plate 27 is disposed using a spacer 25, an upper plate 15 is allowed to expand upward when resin is injected, but unnecessary overexpansion is restricted by the restricting plate 27. Therefore the injection of a slightly larger amount of resin 37 does not cause a distortion or breakage of the upper plate 15 and a large amount resin 37 than the predetermined amount may be injected. As a result, damage to the upper plate 15 by the injection of the resin 37 and damage to the upper plate 15, the exfoliation of the radiation sensitive layer, and the like caused by the curing of the resin 37 may be prevented and damage to the flat panel radiation detector 1 may be prevented thereby.

12 Claims, 7 Drawing Sheets

PROCESS FOR PRODUCING A FLAT PANEL RADIATION DETECTOR AND A FLAT PANEL RADIATION DETECTOR

INCORPORATION BY REFERENCE

The present application claims priority under 35 U.S.C. §119 to Japanese Patent Application No. 2004-169791 filed on Jun. 8, 2004. The content of the application is incorporated herein by reference in its entirety.

BACKGROUND OF THE INVENTION

The present invention relates to a flat panel radiation detector which is used for medical and industrial use and to a process for producing the same, wherein the flat panel radiation detector is composed: of a signal reading substrate on which a radiation sensitive layer that generates an electric charge with an incidence of radiation is mounted; an upper plate placed on top of the signal reading substrate facing the signal reading substrate across the radiation sensitive layer; and resin filling the space between the signal reading substrate and the upper plate.

Formerly, in the process for producing this kind of the flat panel radiation detector (also called "FPD"), resin mold, i.e., filling with a resin, has been practiced to prevent an electric discharge when a high voltage bias is applied to the radiation sensitive layer and to protect the radiation sensitive layer (for example, see Patent Reference 1). The filling is carried out into the space surrounded by a lower face of a glass plate, a spacer and the signal reading substrate/radiation sensitive layer, wherein a spacer is disposed around the signal reading substrate and a glass plate (for example, 0.5-1 mm of thickness) made from a radiation transmitting material is disposed on top of the spacer. The injection is carried out, for example, through an inlet disposed on the spacer, and the gas in the space is let out through an outlet together with the excess resin.

When the resin is injected in such a way, the pressure of the resin injection may cause an expansion of the center of the upper plate upward, and sometimes a severe deformation or damage to the upper plate may result. To avoid this happening, usually the injection is carried out after taking precautions for the upper plate expansion by placing a flat rigid glass plate, a thick metal plate, or the like.

[Patent reference 1] Japanese Laid Open Patent Publication No. 2002-311144

However, the conventional art with such a composition has following problems.

In the conventional process for the production, since almost the same volume of the resin as the volume of the space is injected, a deformation of the upper plate occurs, concaving toward the radiation sensitive layer (inside) in the area distant from the inlet or the outlet, when an epoxy resin, which has an especially high volume shrinkage, is employed. There is a problem in that in the worst case the deformation may result in damage to a part of the upper plate due to the increase in deformation of the upper plate caused by the contraction of the resin.

Further, when the injection pressure of the resin is low, the movement of the resin is reduced during contraction resulting in not enough resin being delivered to compensate the reduced volume due to curing. This leads to more contraction in the volume. Furthermore, after curing, there is residual upward stress as the upper plate attempts to restore its original, flat shape. If the adhesion between the upper plate and the resin (especially epoxy resin) is strong, this stress becomes a force that attempts to peel away the radiation sensitive layer from the signal reading substrate. Consequently, a part of the radiation sensitive layer, for example, the peripheral area where the thickness of the layer is thin, may be separated.

OBJECT AND SUMMARY OF THE INVENTION

The object of the present invention is to overcome the problems described above and to provide a process for producing a flat panel radiation detector and a flat panel radiation detector, wherein damage to the flat panel radiation detector caused by a resin may be prevented by injecting a large amount than the predetermined amount of the resin.

In order to achieve the objects described above, the present invention is structured as follows.

The present invention according to claim 1 provides a process for producing a flat panel radiation detector wherein: a space is established on top of a signal-reading substrate coated with a radiation sensitive layer, with an upper plate disposed therein; and resin fills the space. A spacer with a predetermined height is set up around the upper plate. The space is filled with resin while a restricting member is disposed on an upper part of the spacer.

Because the restricting member is disposed by way of the spacer in the present invention according to claim 1, the upper plate is allowed to expand upward on injection of the resin, but unnecessary overexpansion is restricted by the restricting member. The high pressure applied to the resin in the space by the upper plate expanding upward makes the whole resin contract evenly in the space on curing of the resin. At this time the restoring force is applied to the upper plate. Since the restoration is taking place from the expanded state to the original state, no excess force is applied. Rather, it mitigates the stress in the expanded state, preventing damaging force to the upper plate. Thus even if a large amount resin than necessary is injected, the upper palate is not deformed severely or damaged, and therefore a large amount resin than the predetermined amount can be injected. As a result damage to the upper plate caused by the injection of the resin, and damage to the upper plate and the exfoliation of the radiation sensitive layer and the like caused by the curing of the resin may be prevented, and the damage to the flat panel radiation detector may be prevented.

Further, in the present invention, it is preferable that the spacer and the restricting member are composed as one unit and a recess is formed at the lower face of the restricting unit fitting to the expanded shape of the upper plate (claim 2). A stable expansion of the upper plate is allowed by forming the recess fitting to the expanded shape of the upper plate because the center of the upper plate expands upward most. Therefore, always a large amount resin than the predetermined amount may be injected. Moreover, since the spacer and the restricting member are composed as one unit, the installation to the flat panel radiation detector is easy.

Still further, in the present invention it is preferable that the injection pressure is at least the pressure that allows the upper plate to expand and to reach to the height of the spacer (claim 3). Furthermore, it is preferable that the injection pressure is at least the pressure that allows the upper plate to expand and to reach the recess at the lower face of the restricting member (claim 4). An appropriate amount of the resin may be injected by applying the injection pressure such that the upper plate is expanded to reach the height of the spacer or the recess located on the lower face of the restricting member.

Furthermore, in the present invention it is preferable that the flat panel radiation detector is produced by any one of the process for producing a flat panel radiation detector according to claims 1-4 (claim 5). Since the damage to the upper plate and the exfoliation of the radiation sensitive layer may be prevented, the reliability of the radiation detector may be improved.

(Operation and Advantage) With the implementation of the process for producing the flat panel radiation detector in the present invention, the upper plate is not deformed severely or damaged when a large amount of resin is injected because the restricting member is disposed by way of the spacer and furthermore a large amount of resin may be injected than the predetermined amount. Thus the damage to the upper plate caused by the injection of the resin, and the damage to the upper plate and the exfoliation of the radiation sensitive layer and the like caused by the curing of the resin may be prevented, and the damage to the flat panel radiation detector may be prevented.

The above, and other objects, features and advantages of the present invention will become apparent from the following description read in conjunction with the accompanying drawings, in which like reference numerals designate the same elements.

DETAILED DESCRIPTION OF THE PREFERRED EMBODIMENTS

First Embodiment

The first embodiment of the present invention will be described with reference to the drawings.

Figure 1:
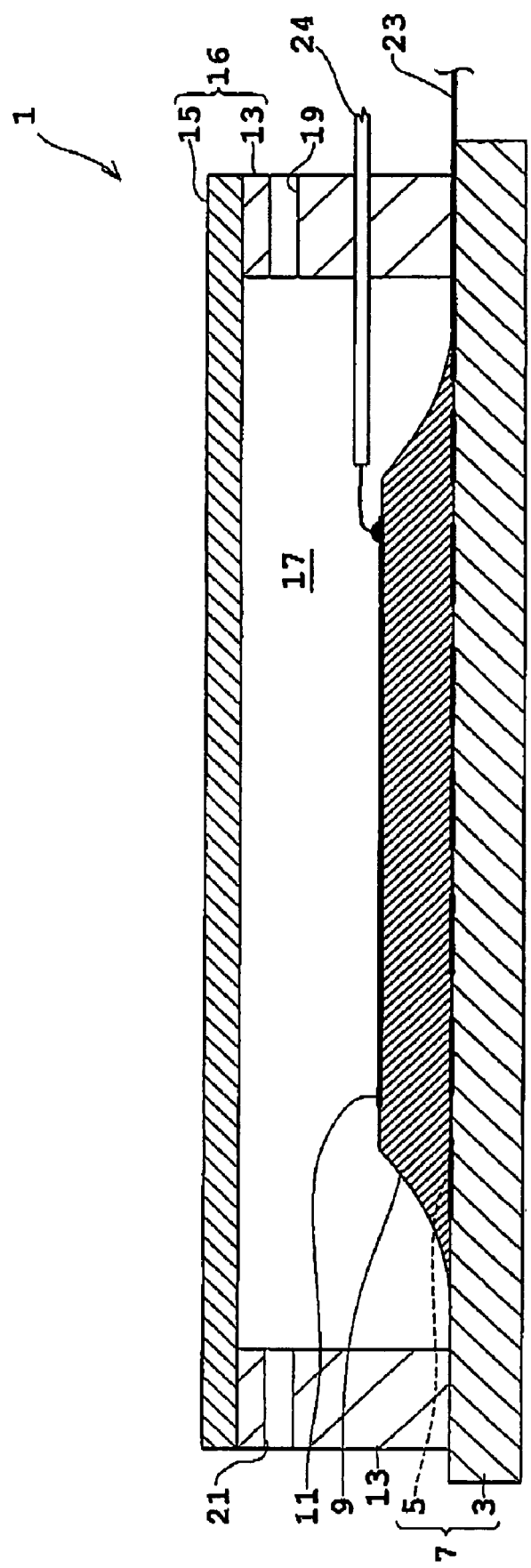
FIG. 1 shows a simplified composition of the flat panel radiation detector of the first embodiment and is a profile before filling with resin.

FIG. 1 is a profile showing the simplified structure of a flat panel radiation detector according to a first embodiment before the filling of the resin.

The flat panel radiation detector 1 is equipped with a signal reading substrate 7 forming a read out circuit 5 on a substrate 3 that is made from an insulating material such as glass. A radiation sensitive layer 9 that generates an electronic charge in response to an incidence of, for example, x ray is disposed on the signal reading substrate. A bias electrode 11 is disposed on the radiation sensitive layer. The radiation sensitive layer may be, for example, amorphous selenium (non-crystalline Se) or a semiconductor layer such as CdZnTe, CdTe, $HgI_2$, $PbI_2$ or the like. The thickness of the radiation sensitive layer is, for example, about 0.5-3 mm. For the bias electrode 11, metal layers such as gold (Au), aluminum (Al) and the like may be used.

A spacer 13, which has a frame-like shape in plan view, is disposed around the substrate 3, and an upper plate 15 is disposed on the spacer 13. A case 16 is composed of the spacer 13 and the upper plate 15. The upper plate 15 may be made from, for example, glass with a thickness, for example, about 0.5-1 mm. The height of the spacer 13 is set at higher than that of the radiation sensitive layer 9. Thus, a space 17 is formed between the upper plate and the substrate 3 which is equipped with the radiation sensitive layer 9. Further, an inlet 19 and an outlet 21 are disposed at two places of the spacer 13 by piercing through it. The read out circuit 5 is connected to a TAB connection pattern 23 that is lead to outside of a case 16. The bias electrode 11 is connected to a cable 24 that is lead to the outside of the case 16. When the voltage applied to the bias electrode 11 is low, the connection can be made through a printed pattern on the substrate 3. The space 17 is filled with a resin, for example, epoxy resin as described below.

Figure 2:
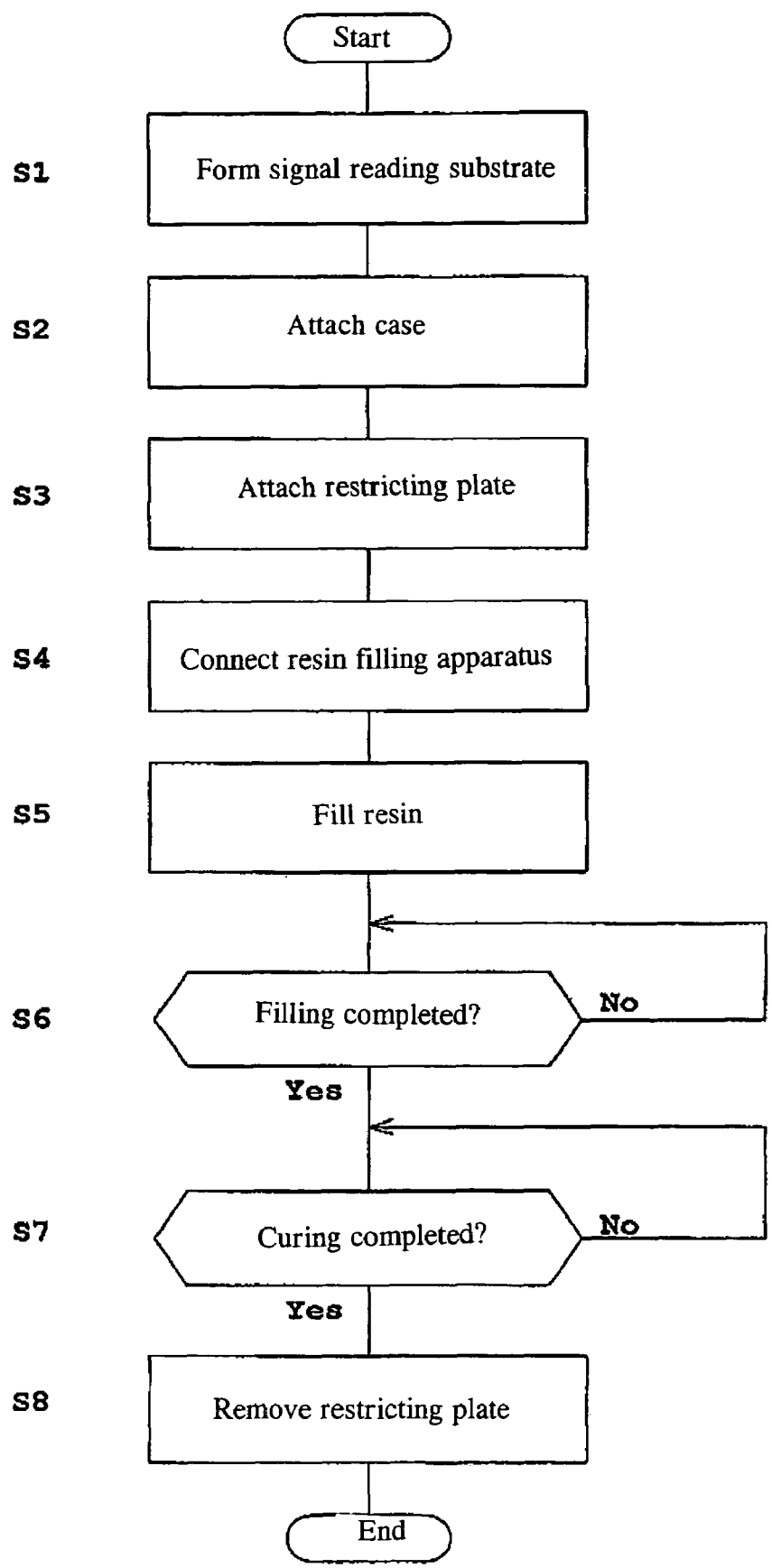
FIG. 2 is a flow chart showing a process for the production of the flat panel radiation detector.

Next, a process for producing the flat panel radiation detector described above is explained by referring FIG. 2-9. FIG. 2 is a flow chart showing a process for the production of the flat panel radiation detector and FIG. 3-9 are profiles showing each step of the process of the production.

Step S1

Figure 3:
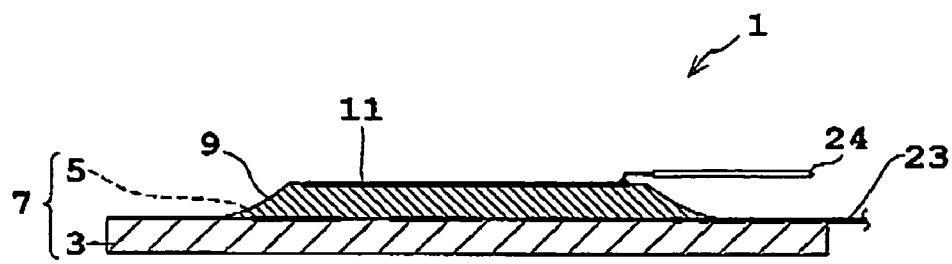
FIG. 3 is a profile showing the signal reading substrate when it is formed.

As shown in FIG. 3, the signal read out circuit 5 is formed on the substrate 3, and the TAB connecting pattern 23 is extended out. Further, the radiation sensitive layer is attached on top of them and at the same time the cable 24 is extended out. These form the signal reading substrate 7.

Step S2

Figure 4:
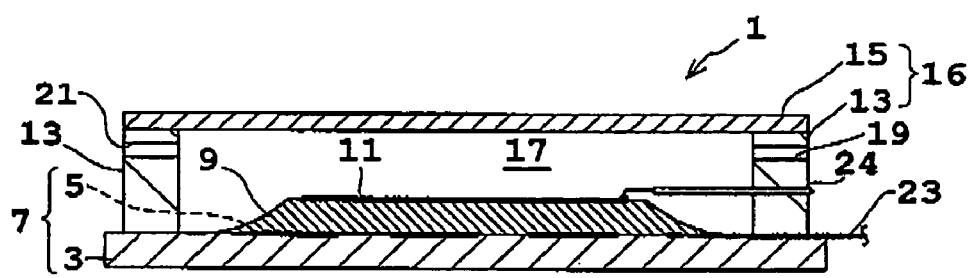
FIG. 4 is a profile showing the case when it is attached.

As shown in FIG. 4, the spacer 13 and the upper plate 15 are attached, and the case 16 is attached to the signal reading substrate 7.

Step 3

Figure 5:
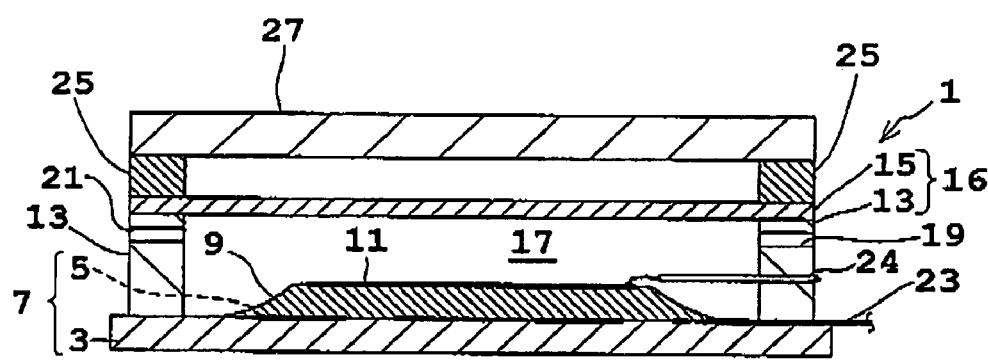
FIG. 5 is a profile showing the restricting panel attached.

As shown in FIG. 5, the spacer 25 is attached on top of the upper plate 15, and at the same time the restricting plate 27 on top of the spacer 25 is attached. The restricting plate 27 is made from, for example, glass with a thickness of about 5-10 mm. The restricting plate 27 has enough strength not to be deformed by the pressure applied from the resin through the upper plate 15. The spacer 25 and the restricting plate 27 may be attached by adhesion, but it is preferable to attach to the flat panel radiation detector by using a holding tool since it can be removed after the production.

The restricting plate 27 described above corresponds to the restricting member in the present invention.

Step S4

Figure 6:
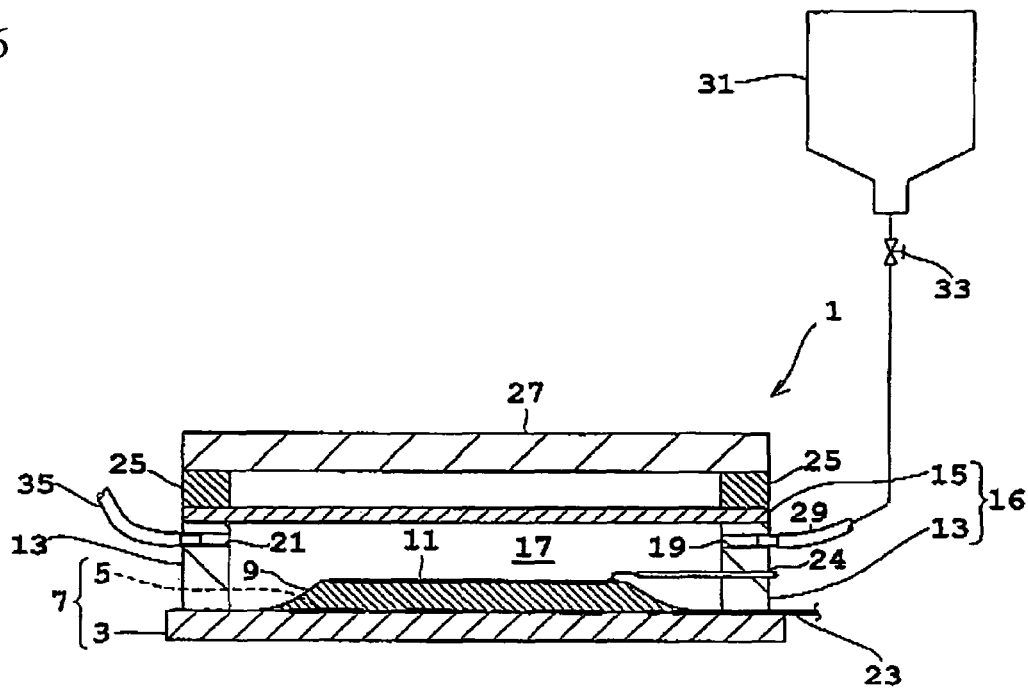
FIG. 6 is a profile showing the resin filling apparatus in a connected state.

As shown in FIG. 6, an injection pipe 29 is attached to the inlet 19. The injection pipe 29 is connected to a resin tank 31 that is placed at a higher position than the inlet 19, and a valve 33 is disposed on the injection pipe 29. Further, an outlet pipe 35 is connected to the outlet 21.

Step S5

Figure 7:
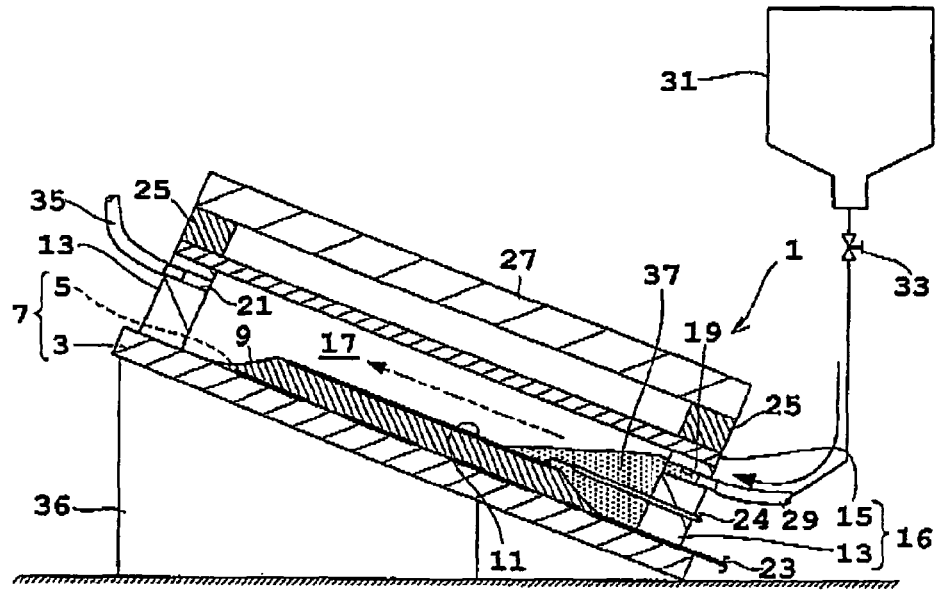
FIG. 7 is a profile showing the panel being filled with resin.

As shown in FIG. 7, the flat panel radiation detector 1 is placed on a sloped surface of a sloped base 36. On this occasion, the inlet 19 is positioned at a higher place than the outlet 21. Then the resin 37 is injected from the resin tank 31 by opening the valve 33. The angle of the slope is preferably, for example, in the range of 10-30 deg C. The injection pressure of the resin 37 may be increased by keeping the flat panel radiation detector in a slanting position and by placing the inlet 19 at a higher position than the outlet 21. A filler and the like may be added to the resin 37, if necessary, and a resin composition that is de-gassed in vacuo beforehand may be used.

Step S6

Figure 8:
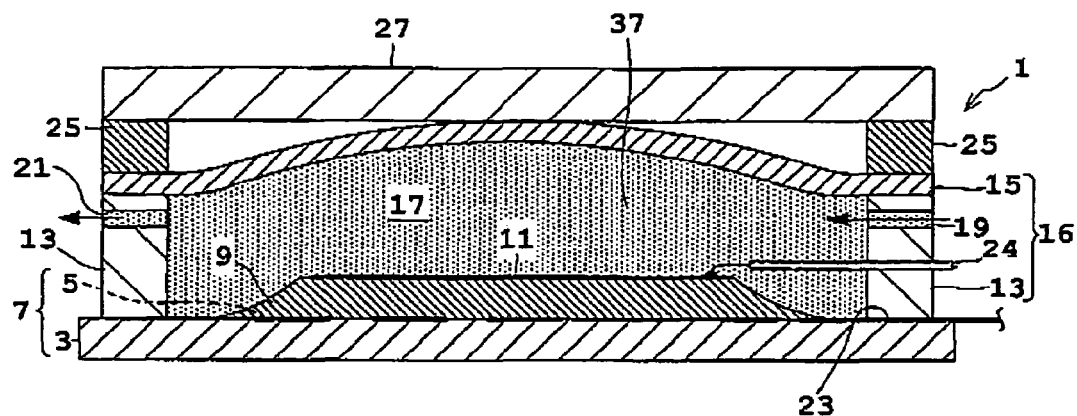
FIG. 8 is a profile showing the completion of the filling operation.

On starting the injection of the resin 37, the space 17 is filled gradually upward with the resin 37 as shown in FIG. 7 with a dashed arrow, and the air that has been in the space 17 is let out from the outlet 35. After the space 17 is filled with the resin 37, the resin is poured out of the outlet 21 and collected in the outlet pipe 35 as the flow of resin 37 continues. Since the resin 37 is injected with a high injection pressure at this time, the upper plate 15 is pressed by the resin 37 and deformed by expansion of the central part of the upper plate 15 toward the opposite direction of the substrate 3 as shown in FIG. 8 (for convenience sake, the flat panel radiation detector 1 is shown in the horizontal position). However, the deformation of the upper plate 15 stops due to the restriction imposed by the lower face of the restricting plate 27 as shown in FIG. 8. The outlet pipe 35 is extended to a higher position than the flat panel radiation detector 1 at the time of injection, and the liquid level of the resin 37 reaches at a higher position than the flat panel radiation detector 1 and is equilibrated at the same position with the liquid level on the side of the inlet pipe 29 and the resin tank 31. At this position the pressure is maintained so that the upper plate 15 is kept at the predetermined height until the resin 37 is cured.

The injection pressure of the resin 37 may be increased by using a pressurizing pump instead of raising the resin tank 31 above the inlet 19 as described above.

Step S7

After completing the filling, the flat panel radiation detector 1 is taken out from the sloped base 36, and the resin 37 is cured while keeping the flat panel radiation detector 1 in a horizontal position. The curing may be performed while keeping the flat panel radiation detector 1 in a slanting position. The volume of the resin is decreased by contraction on curing, but the shape of the upper plate 15 that is expanded upward is maintained.

Step S8

Figure 9:
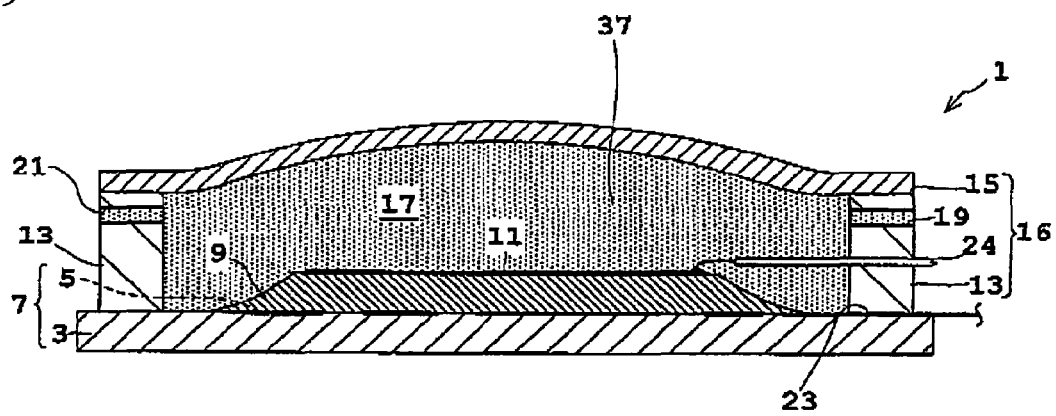
FIG. 9 is a profile showing the restricting panel removed.

After the curing is completed, the injection pipe 29 and the outlet pipe 35 are cut off at the side of the spacer 13, and the spacer 25 and the restricting plate 27 are removed. FIG. 9 shows the state at this step. Since the resin 37 is cured completely, the shape of the upper plate 15 with the upwardly expanded center is maintained.

Because the restricting plate 27 is disposed by way of the spacer 25, the upper plate is allowed to expand upward upon injection of the resin, but unnecessary overexpansion is restricted by the restricting plate 27. The high pressure applied to the resin in the space 17 by the upper plate 15 expanding upward makes the whole resin contract evenly in the space 17 upon curing of the resin. At this time restoring force is applied to the upper plate 15. Since the force is directed from the expanded state to the original state, no excess force that would lead to breakage is applied. Rather, it mitigates the stress in the expanded state, and no damaging force is applied to the upper plate 15. Thus even if a larger amount resin 37 than necessary is injected, the upper palate 15 is not deformed severely or damaged, and therefore a larger amount resin 35 than the predetermined amount can be injected. As a result the damage to the upper plate 15 caused by the injection of the resin 37, and the damage to the upper plate 15 and the exfoliation of the radiation sensitive layer and the like caused by the curing of the resin 37 may be prevented, and the damage to the flat panel radiation detector 1 may be prevented.

Furthermore, in the flat panel radiation detector 1, which is produced by the process for the production described above, the damage to the upper plate 15 and the exfoliation of the radiation sensitive layer 9 may be prevented and thus the reliability of the flat panel radiation detector is strengthened.

Second Embodiment

Next, the second embodiment of the present invention will be explained with reference to the figures.

Figure 10:
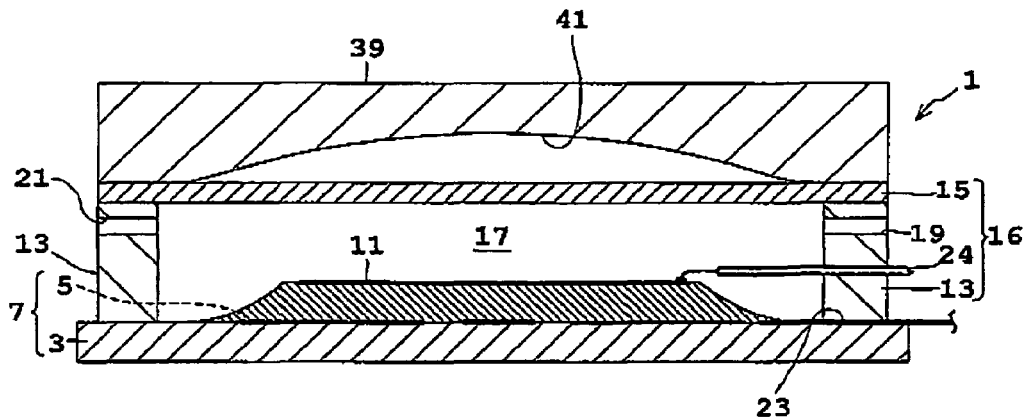
FIG. 10 shows a step in the process for producing the flat panel radiation detector of the second embodiment and is a profile showing the case when it is attached.
Figure 11:
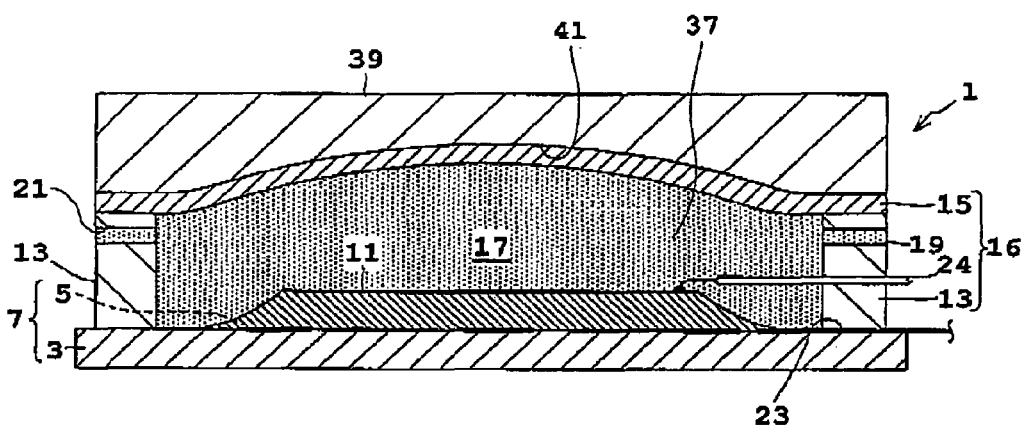
FIG. 11 is a profile showing the completion of the filling operation.

FIG. 10 shows a step in the process for producing the flat panel radiation detector of the second embodiment and is a profile showing the step where the case is attached. FIG. 11 is a profile showing the state at the end of the filling of the resin. When the composition is similar to that described in the first embodiment, detailed explanation is omitted by using the same numerals.

In the first embodiment described above, the restricting plate 27 and the spacer 25 are used but the difference in the second embodiment is that these two are unified to make a restricting plate 39. The restricting plate 39 that is a restricting member in the present invention has a recess 41 formed on its bottom face. The recess 41 is shaped so that it fits against the shape of the upper plate 15 when it is expanded in response to the filling of the resin. Thus, the depth of the recess 41 is the same as the height of the spacer 25 in the first embodiment.

In the second embodiment, a stable expansion of the upper plate 15 may be allowed by forming the recess 41 in the shape of the expanded upper plate 15, because the greatest upward expansion of the upper plate 15 takes place in the central part. Thus, a large amount resin 37 than the predetermined amount may always be injected. Furthermore, since the spacer 13 and the restricting plate 27 are composed as one unit, it is easy to attach to the flat panel radiation detector 1 without the need to attach the spacer 13.

The present invention is not limited to the embodiments described above but may be modified as follows.

Figure 12:
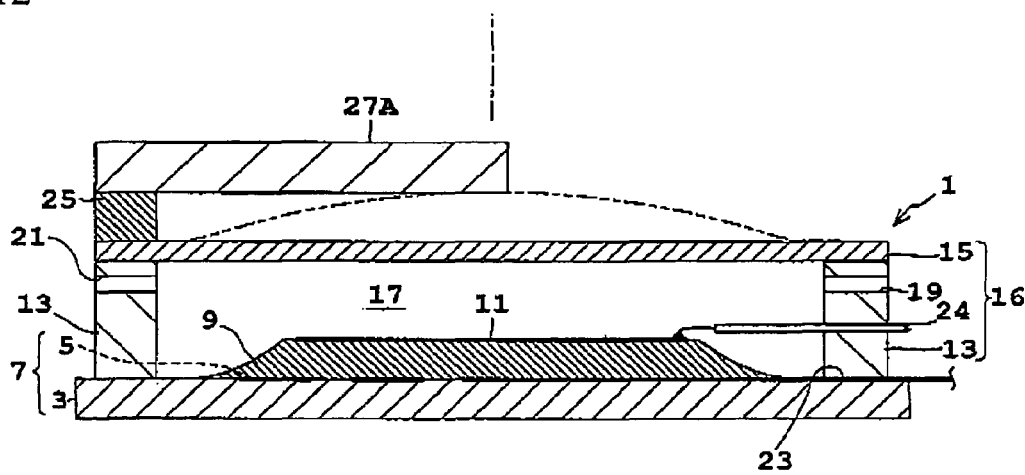
FIG. 12 is a profile showing a modified example.

(1) In each embodiment described above, the restricting plate 27 and 39 are placed so that almost whole surface of the flat panel radiation detector 1 is covered. However, the restricting plate 27A (corresponding to the restricting member of the present invention) may be one which covers the area from the periphery to the middle area as shown in FIG. 12. By this modification the overexpansion of the middle part of the upper plate 15 is restricted to a predetermined point, and the composition of the restricting plate 27A is simplified.

Figure 13:
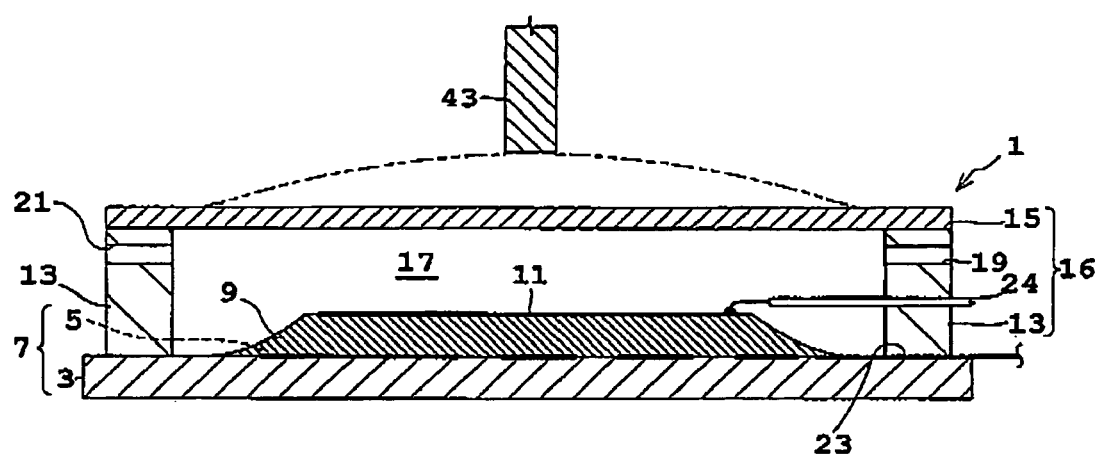
FIG. 13 is a profile showing a modified example.

(2) Further, in place of the panel like restricting plate 27 and 27A, a restricting member 43 may be installed as shown in FIG. 13 that restricts the overexpansion beyond the predetermined point by touching to the area of the center of the upper plate 15. In addition to providing similar operations and curing features, the use of the rod-shaped restricting member 43 also allows the composition to be simplified. Furthermore, the degree of the expansion may be adjusted easily by controlling the height of the position of the restricting member 43.

(3) In each embodiment described above, epoxy resin is used as one of the examples of the resin. However, the resin may be substituted with any other resin as long as they are inert to the substrate 3, the radiation sensitive layer 9 and the signal reading substrate 7. Alternatively, a liquid or a gel resin may be used.

(4) The resin may be filled, for example, by exhausting the air from the space 17 by a vacuum pump and the like without using the sloped base 36.

(5) Rather than being sensitive to X-rays, the radiation sensitive layer 9 may be sensitive to other radiations.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A process for producing a flat panel radiation detector comprising:
   providing a space above a signal-reading substrate coated with a radiation sensitive layer, with an upper plate disposed within said space by setting a spacer with a predetermined height around said upper plate;
   filing said space with resin with a restricting member being disposed at an upper part of said spacer; and
   removing the restricting member after the resin is cured.

2. A process for producing a flat panel radiation detector according to claim 1, further comprising:
   integrally structuring said spacer and said restricting member; and
   forming, at a lower face of said restricting member, a recess with a shape to conform with an expanded shape of said upper plate.

3. A process for producing a flat panel radiation detector according to claim 2, further comprising:
   applying an injection pressure for expanding said upper plate to reach said recess at said lower face of said restricting member.

4. A flat panel radiation detector, comprising:
   said detector produced by said process for producing a flat panel radiation detector according to claim 2.

5. A flat panel radiation detector, comprising:
   said detector produced by said process for producing a flat panel radiation detector according to claim 3.

6. A process for producing a flat panel radiation detector according to claim 1, further comprising:
   applying an injection pressure for expanding said upper plate to reach a height of said spacer.

7. A flat panel radiation detector, comprising:
   said detector produced by said process for producing a flat panel radiation detector according to claim 6.

8. A flat panel radiation detector, comprising:
   said detector produced by said process for producing a flat panel radiation detector according to claim 1.

9. A process for producing a flat panel radiation detector comprising:
   providing a signal-reading substrate, coating the signal-reading substrate with a radiation sensitive layer;
   providing a first spacer with a predetermined height between an upper plate disposed above said signal-reading substrate and said signal-reading substrate;
   providing a second spacer with a predetermined height between a restricting member disposed above said upper plate and said upper plate; and
   filing said space between the signal-reading substrate and said upper plate with resin while the restricting member restricts the expansion of the resin.

10. A process for producing a flat panel radiation detector according to claim 9, further comprising:
    integrally structuring said second spacer and said restricting member; and
    forming, at a lower face of said restricting member, a recess with a shape to conform with an expanded shape of said upper plate.

11. A process for producing a flat panel radiation detector according to claim 9, further comprising:
    applying an injection pressure for expanding said upper plate to reach a height of said spacer.

12. A process for producing a flat panel radiation detector according to claim 11, further comprising:
    applying an injection pressure for expanding said upper plate to reach said recess at said lower face of said restricting member.

* * * * *